(12) United States Patent
Landre

(10) Patent No.: US 6,541,955 B2
(45) Date of Patent: Apr. 1, 2003

(54) CLAMP FOR MEASURING AN ELECTRICAL CURRENT FLOWING IN CONDUCTORS

(75) Inventor: Bernard Landre, Paris (FR)

(73) Assignee: Universal Technic, Paris (FR)

( * ) Notice: Subject to any disclaimer, the term of this patent is extended or adjusted under 35 U.S.C. 154(b) by 0 days.

(21) Appl. No.: 09/889,043

(22) PCT Filed: Jan. 10, 2000

(86) PCT No.: PCT/FR00/00032

§ 371 (c)(1),
(2), (4) Date: Jul. 11, 2001

(87) PCT Pub. No.: WO00/42441

PCT Pub. Date: Jul. 20, 2000

(65) Prior Publication Data

US 2003/0006754 A1 Jan. 9, 2003

(30) Foreign Application Priority Data

Jan. 12, 1999 (FR) .............................. 99 00215

(51) Int. Cl.[7] .............................................. G01R 21/00
(52) U.S. Cl. ................ 324/127; 324/117 R; 324/117 H
(58) Field of Search ............................. 324/127, 117 R, 324/117 H, 129, 149, 116, 126, 378, 115, 158.1, 121 R; 364/483, 481

(56) References Cited

U.S. PATENT DOCUMENTS 3,199,026 A * 8/1965 Leibowitz .................. 324/127
3,706,032 A * 12/1972 Vikstrom .................... 324/127
4,316,142 A * 2/1982 Kuramoto ................... 324/127
4,656,418 A * 4/1987 Boston et al. ............... 324/127
5,349,289 A * 9/1994 Shirai ......................... 324/127
5,610,512 A * 3/1997 Selcuk ........................ 324/127

FOREIGN PATENT DOCUMENTS

FR          A2673727          9/1992

* cited by examiner

Primary Examiner—Kamand Cuneo
Assistant Examiner—Jimmy Nguyen
(74) Attorney, Agent, or Firm—Birch, Stewart, Kolasch & Birch, LLP

(57) ABSTRACT

A clamp for measuring an electric current flowing in conductors, the clamp comprising first and second jaws (1, 2) interconnected by a hinge axis (3) to be movable between a closed position and an open position, the jaws being provided respectively with first and second annular magnetic circuit segments (4, 5), each segment (4, 5) having a proximal end (7, 8) and a distal end (9, 10) relative to the hinge, and at least the first segment (5) being mounted to rock about a rocker axis (6) parallel to a hinge axis (3), the clamp including spacer means (12) for spacing the proximal ends (7, 8) apart, which spacer means are active at least when the distal ends (9, 10) are spaced apart by a distance that is greater than or equal to a predetermined safety distance.

7 Claims, 3 Drawing Sheets

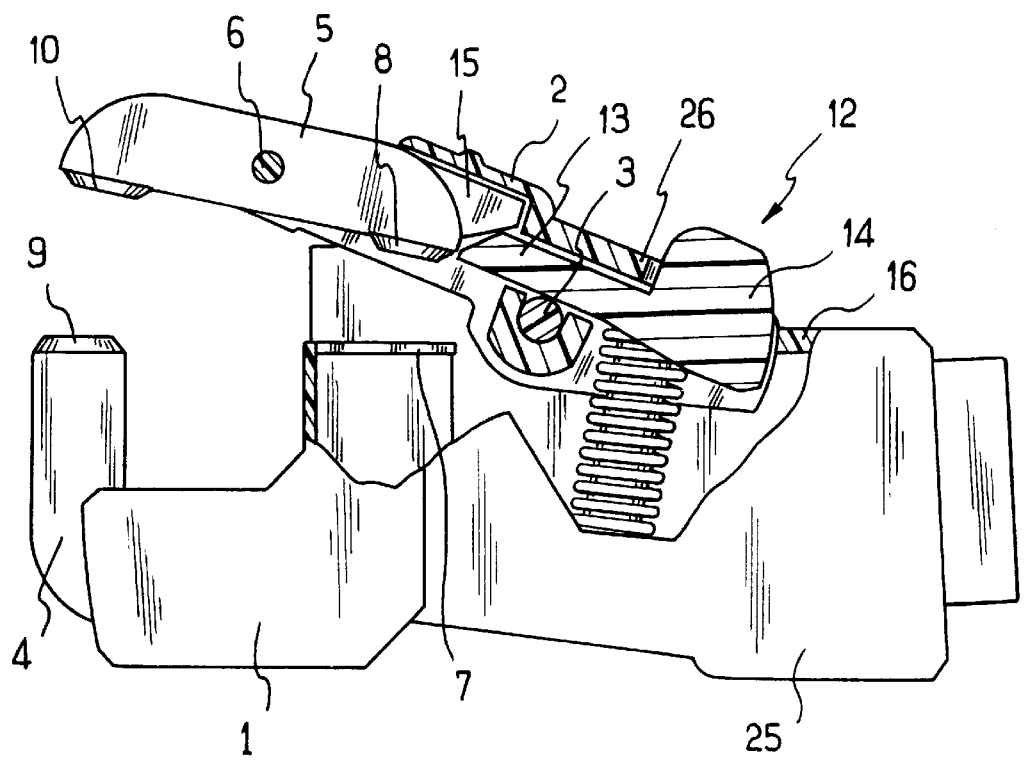
FIG_3
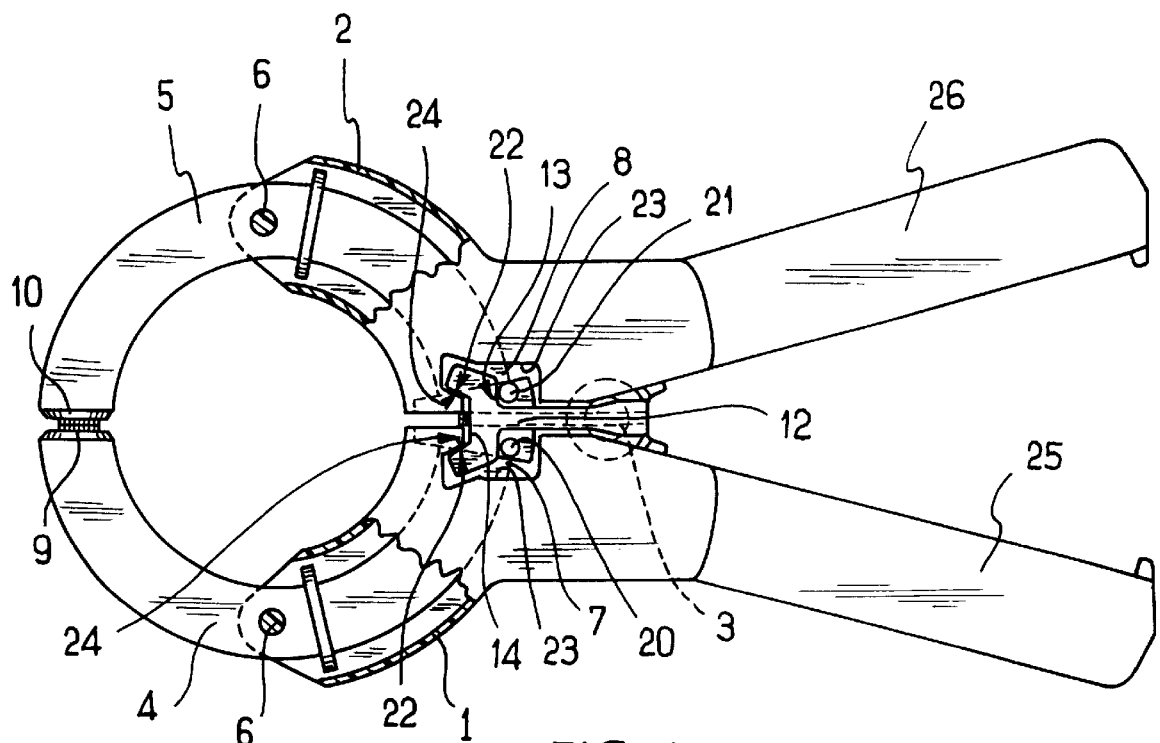
FIG_4

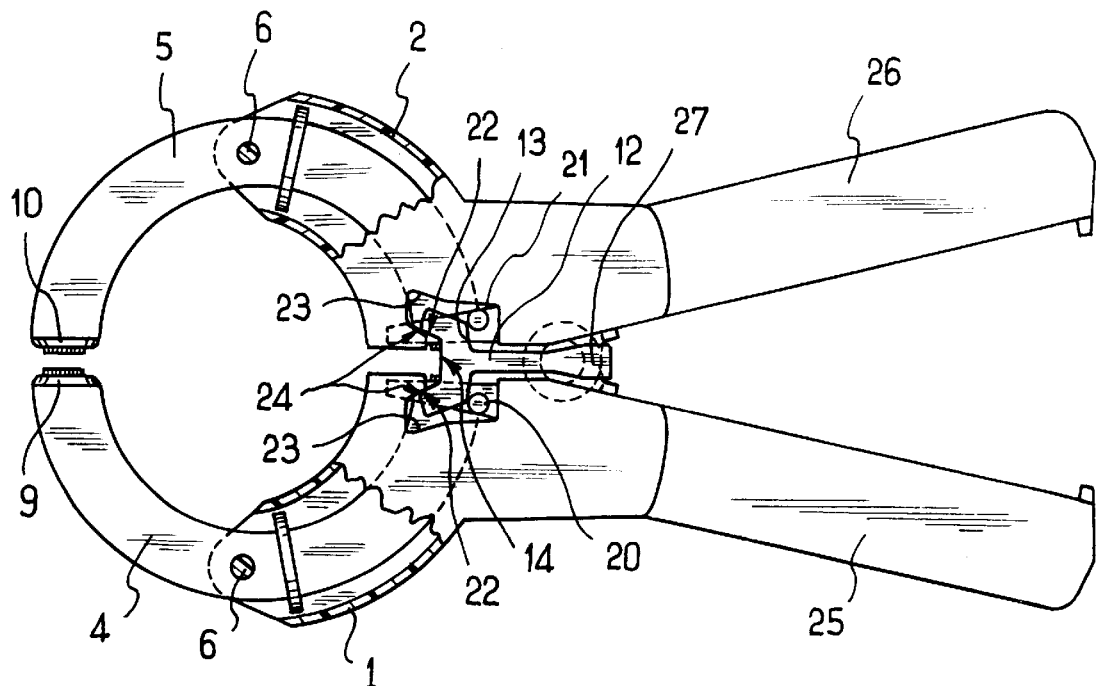
FIG_5
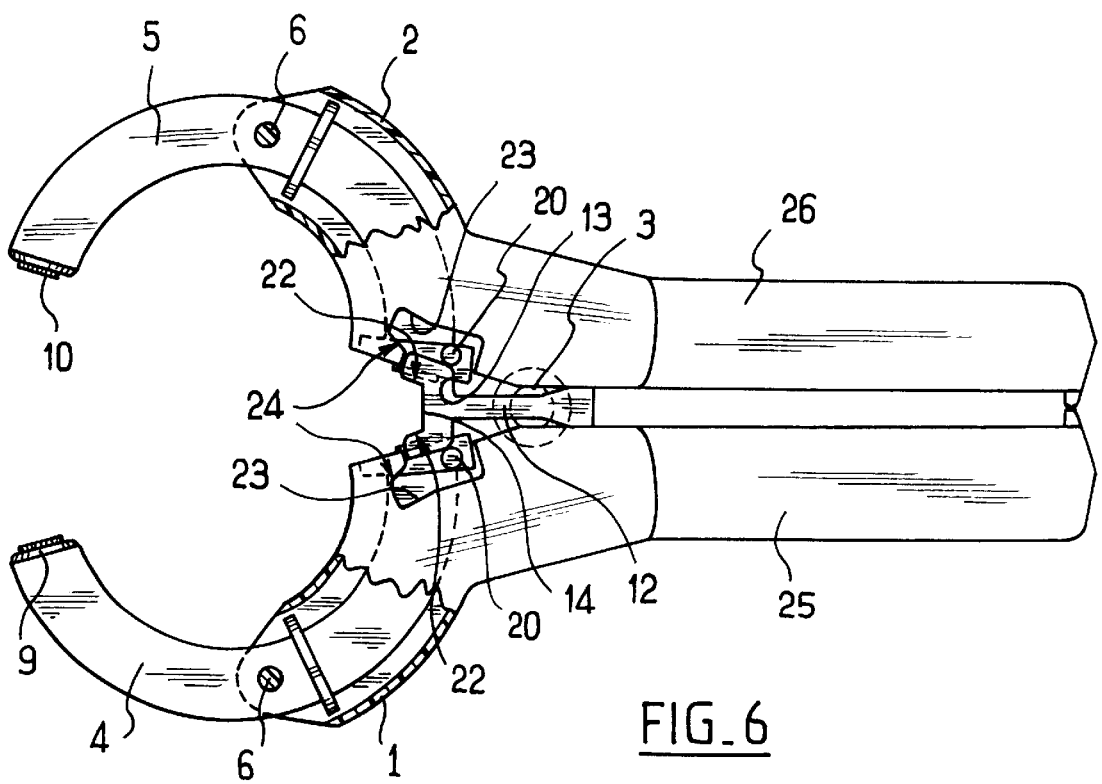
FIG_6

CLAMP FOR MEASURING AN ELECTRICAL CURRENT FLOWING IN CONDUCTORS

This application is the national phase under 35 U.S.C. §371 of PCT International Application No. PCT/FR00/00032 which has an International filing date of Jan. 10, 2000, which designated the United States of America and was not published in English.

The present invention relates to a clamp for measuring an electrical current flowing in conductors.

BACKGROUND OF THE INVENTION

Clamps of this type generally comprise two jaws interconnected by a hinge and each provided with a segment of an annular magnetic circuit, each segment having a proximal end and a distal end relative to the hinge. The jaws are hinged to move between a closed position in which the distal and proximal ends of the segments are respectively in contact, and an open position in which the distal and proximal ends are spaced apart.

When the clamp is closed around a live conductor, the electrical current carried by the conductor induces magnetic flux in the annular magnetic circuit that has been closed in this way. A measurement member associated with the clamp measures this magnetic flux which is proportional to the current and it calculates the value of the current.

To avoid magnetic flux losses and thus obtain measurement that is accurate, it is necessary for good quality magnetic contact to be established via the proximal ends and via the distal ends of the segments when the clamp is closed. At least one segment is thus mounted to rock about a rocker axis parallel to the hinge axis so that the segments can be applied properly against each other at their distal and proximal ends.

In an installation comprising a plurality of conductors, and in particular bare conductors, the operator handling the clamp must take care not to set up a short circuit between two adjacent conductors by contact between them and the magnetic circuit. To limit this risk, the segments are covered in an insulating coating with the exception of the distal and proximal ends. Nevertheless, with clamps of the above-described type, there exists a risk that the distal ends of an open clamp will come into contact with two adjacent conductors, and because the segments are movable relative to the jaws, the proximal ends of the segments will come into contact, thereby establishing a short circuit between two conductors. Such short circuiting is dangerous for the operator and runs the risk of damaging the installation.

It has thus been proposed to surround one of the distal ends with a protective cover, with the distal end being set back therein. The cover enables the distal end fitted in this way to make contact with the distal end of the other segment, but it prevents the distal end from coming into contact with a conductor, such that even if the proximal ends are in contact there is no short circuit between conductors. Nevertheless, the cover increases the size of the distal end which makes it difficult to insert it between the conductors that are to be measured. In addition, such a cover is very exposed to impacts that might damage it, thereby reducing or eliminating protection. Furthermore, various particles can accumulate in the setback formed by the cover, thereby preventing good contact being established with the other distal end. In addition, the cover makes it impossible to verify by eye the that contact has been properly established between the distal ends.

OBJECTS AND SUMMARY OF THE INVENTION

An object of the invention is to provide a clamp having means for preventing a short circuit being established between two adjacent conductors without using a cover on the distal ends of the magnetic circuit segments.

In order to achieve this object, the invention provides a measuring clamp for measuring an electric current carried by conductors, the clamp comprising first and second jaws connected together by a hinge and provided with respective first and second segments of an annular magnetic circuit, each segment having a proximal end and a distal end relative to the hinge, and at least the first segment being mounted to rock about a rocker axis parallel to a hinge axis, the jaws being movable about the hinge axis between a closed position in which the distal ends and the proximal ends of the segments are respectively in contact, and an open position in which the distal ends and the proximal ends are spaced apart, the clamp including spacer means for spacing apart the proximal ends, which means are active at least while the distal ends are spaced apart by a distance that is greater than or equal to a predetermined safety distance.

The safety distance is determined so as to correspond to the minimum distance separating two conductors, given the voltage to which they are raised. Thus, the proximal ends are held apart from each other at least so long as there remains any risk of the distal ends coming into contact with two adjacent conductors. The magnetic circuit is thus kept open at its proximal ends, and the risk of a short circuit being established is eliminated.

In an advantageous version of the invention, the spacer means comprise a moving member mounted to slide between an active position in which the moving member has a cam-forming portion co-operating at least with the proximal end of the first segment to space it apart from the proximal end of the second segment, and an inactive position in which the moving member releases relative movement between the segments.

In a first embodiment, the moving member in the inactive position is associated with a stop for locking the jaws closer than an intermediate open position in which the distal ends are spaced apart by a distance equal to the safety distance, and the moving member in the active position escaping from this stop. Any opening of the clamp beyond the safety distance thus requires the moving member to be pushed into the active position.

In a second embodiment, the moving member extends between at least one cam surface carried by one jaw and an adjacent projection at the proximal end of a magnetic circuit segment mounted to rock on the corresponding jaw, the cam-forming portion of the moving member extending in register with the corresponding projection of the magnetic circuit segment. Thus, opening the clamp automatically activates the spacer means.

BRIEF DESCRIPTION OF THE DRAWINGS

Other characteristics and advantages of the invention will appear on reading the following description of particular, non-limiting embodiments of the invention.

Reference is made to the accompanying drawings, in which:

FIGS. 1, 2, and 3 are partially cutaway elevation views of a clamp constituting a first embodiment, shown respectively in the closed position, in an intermediate position prior to opening, and in the open position; and FIGS. 4, 5, and 6 are partially cutaway elevation views showing a clamp constituting a second embodiment, respectively in the closed position, in an intermediate position, and in the open position.

MORE DETAILED DESCRIPTION

Figure 1:
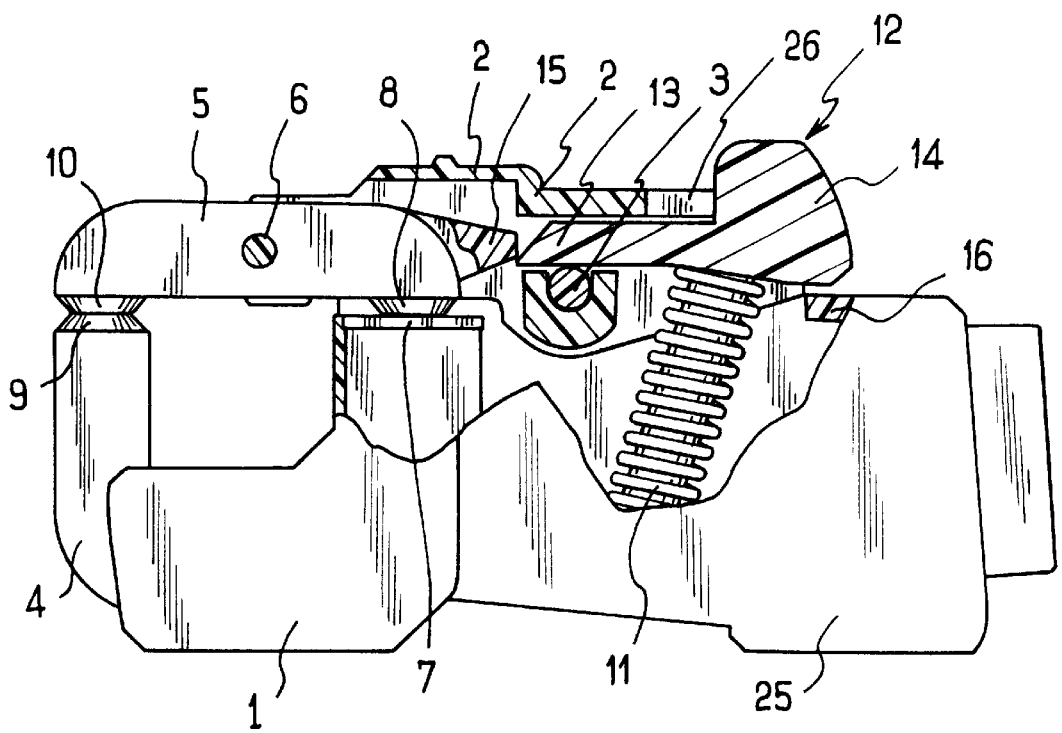
Figure 2:
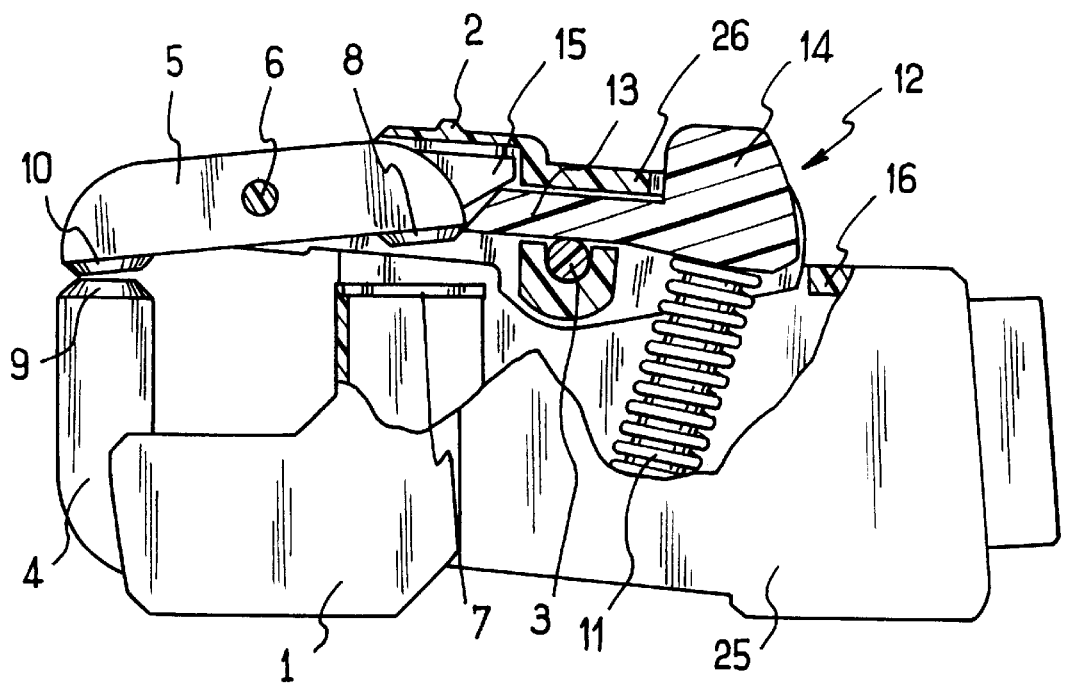

With reference to FIGS. 1 to 3, the first embodiment of a clamp comprises two jaws 1 and 2 interconnected by a hinge axis 3 which extends perpendicularly to the plane of the figure, and the jaws are extended beyond the axis by handles 25, 26.

A U-shaped segment 4 of an annular magnetic circuit is secured to the jaw 1, and a segment 5 of the annular magnetic circuit is mounted on the jaw 2 via an axis 6 parallel to the hinge axis 3 so as to allow the segment 5 to rock relative to the jaw 2.

Each segment 4, 5 has a proximal end 7, 8 and a distal end 9, 10 relative to the hinge axis 3. The segments 4 and 5 are made of ferromagnetic material covered in insulating material, and only the proximal and distal ends 7, 8; 9, 10 are uncovered. The annular magnetic circuit is associated in conventional manner with an electrical circuit for measuring the flux in the magnetic circuit, e.g. comprising a coil surrounding at least a portion of the magnetic circuit and associated with a member for measuring the current flowing in the coil.

The jaws 1, 2 are hinged to each other to move between a closed position in which the segments 4 and 5 are in contact with each other via the proximal ends 7, 8 and the distal ends 9, 10 so as to form an annular magnetic circuit (see FIG. 1), and an open position in which the proximal ends 7, 8 and the distal ends 9, 10 are spaced apart (see FIG. 3). A spring 11 extending between the handles 25 and 26 urges the jaws resiliently towards their closed position.

In accordance with the invention, the clamp has spacer means comprising a moving member 12 with a portion 13, in this case an end portion, that forms a cam and an opposite end 14 shaped as a pusher.

The moving member 12 is mounted on the jaw 2 to slide between an active position, shown in FIG. 2, in which the cam-forming end 13 bears against a projection 15 forming part of the segment 5 at its proximal end 8 so as to space the proximal end 8 away from the proximal end 7, and an inactive position, shown in FIG. 1, in which the moving member is withdrawn from its active position so that the end 13 no longer co-operates with the projection 15 and thus leaves the segment 5 free to rock about the axis 6.

When the jaws are in the closed position and the moving member 12 is in the inactive position (FIG. 1), the distal and proximal ends are respectively in contact and the pusher-forming end 14 projects in the vicinity of the handle 26 so as to extend over a stop 16 forming a part of the handle 25. Any force applied to the jaw 2 tending to open the clamp thus brings the end 14 against the stop 16 which opposes pivoting of the jaw 2 about the hinge axis 3.

When the moving member 12 is moved into its active position (FIG. 2) by the operator, then the end 14 escapes from the stop 16 while the end 13 co-operates with the projection 15 to space the proximal end 8 away from the proximal end 7, while leaving the distal ends 9 and 10 in contact. This spacing is made possible by the jaw 2 tilting slightly about the axis 3.

It is then possible by exerting pressure on the end 14 to bring the jaws 1 and 2 into the open position (FIG. 3).

The clamp is closed by performing the operations in reverse order.

It will be understood that when the moving member is in its active position, the segment 5 is prevented from rocking about the axis 6 so the segment 5 is in a position such that the proximal ends are spaced apart from each other, thereby keeping the magnetic circuit open and this applies regardless of whether the jaws are open or closed.

On closure, the distal ends come into contact with each other while the proximal ends are still held spaced apart by the moving member.

The stop 16 could equally well be disposed in such a manner that without moving the moving member, it allows the jaws 1 and 2 to be opened as far as an intermediate position in which the distal ends 9 and 10 are spaced apart by a distance that is less than or equal to a predetermined safety distance. It would then be possible to open the jaws part way, e.g. to engage the clamp around a single conductor, while still requiring the spacer member 12 to be moved positively if the jaws are to be opened by more than the safety distance. The safety distance is determined to correspond to the minimum distance between two adjacent conductors in the installation for which the clamp is intended. This minimum distance is proportional to the potential difference that exists between the conductors.

A second embodiment of a clamp is described below with reference to FIGS. 4 to 6, and elements that are identical or analogous to those described above are given identical numerical references in the description below.

The clamp constituting the second embodiment comprises two jaws 1 and 2 connected to each other by a hinge axis 3 and extended beyond the axis by handles 25 and 26.

Each jaw 1, 2 has a semicircular segment of an annular magnetic circuit 4, 5 mounted to rock thereon about a respective axis 6 parallel to the hinge axis 3.

Each of the segments 4, 5 has a proximal end 7, 8 and a distal end 9, 10 relative to the hinge axis 3.

As before, the jaws 1, 2 are hinged to each other to move between a closed position into which they are urged resiliently and in which the segments 4 and 5 are in contact with each other via their proximal ends 7, 8 and their distal ends 9, 10 so as to form the annular magnetic circuit (see FIG. 4), and an open position in which the proximal ends 7, 8 and the distal ends 9, 10 are spaced apart (see FIG. 6).

The magnetic circuit segments 4 has two studs 20 (only one of which is visible in the figure) adjacent to the proximal end 7 and projecting parallel to the axis 6 on opposite sides of a plane containing the magnetic circuit. Similarly, the magnetic circuit segment 5 has two studs 21 (only one of which is visible in the figure) adjacent to the proximal end 8.

The studs 20 and 21 situated on the same side of the magnetic circuit extend in two notches 23 corresponding thereto in two facing sides of the jaws 1, 2. Each notch 23 has a cam surface 24.

The spacer means comprise two moving members 12 placed on either side of the plane containing the magnetic circuit and extending parallel thereto, each in the form of a plate having a cam-forming portion 13 and an opposite edge 14 having two steps 22 extending over the cam surfaces 24 when the clamp is in a closed position. The moving members 12 are preferably held in place by a caliper (not shown) placed astride the two jaws.

Each moving member 12 is received in the housing defined by two notches 23 so as to extend between the cam surfaces 24 and the studs 20, 21 and so as to be movable between an inactive position and an active position.

When the jaws 1, 2 are in the closed position (FIG. 4), each moving member is in its inactive position. The cam surfaces 24 are then received between the steps 22 and the edge 13 is merely in contact with the studs 20, 21.

While the jaws are being opened (FIG. 5), the cam surfaces 24 bear against the steps 22 so as to move the moving member towards its active position. The cam-forming portion 13 then presses against the studs 20, 21 causing the segments 4, 5 to tilt about the axes 6 in the direction causing the proximal ends 7, 8 to be spaced apart from each other.

When the jaws 1, 2 are in the open position (FIG. 6), the cam surfaces 24 have pushed the moving member between the studs 20, 21, thereby preventing the proximal ends 7, 8 from moving towards each other.

Because of the limited amount of movement available to the magnetic circuit segments, when the clamp is being closed the studs 20, 21 bear against the moving member 12 so as to return it and release the studs 20, 21 at the end of closure. Each moving member 12 preferably has a tail 27 which extends between the jaws beyond the cam-forming portion 13 so as to prevent the moving member toppling when the clamp is in the open position. This prevents the jaws becoming locked in the open position.

It will be observed that in this embodiment the moving member is brought into the active position automatically as soon as the jaws begin to be opened. Furthermore, on closure, the distal ends come into contact with each other while the proximal ends are still held spaced apart by the moving member.

Naturally, the invention is not limited to the embodiment described and variants can be applied thereto without going beyond the scope of the invention as defined by the claims.

In particular, in the second embodiment, the moving member in the active position could be arranged to become inserted between the proximal ends of the annular magnetic circuit segments.

It would also be possible to arrange the cam surfaces 24 and the steps 22 (by changing their relative positions) in such a manner that the moving members 12 are held in the active position only while the distal ends 9, 10 are spaced apart by a distance that is greater than the safety distance.

What is claimed is:

1. A measuring clamp for measuring an electric current carried by conductors, the clamp comprising first and second jaws (1, 2) associated with at least one drive member (25, 26), the jaws (1, 2) being connected together by a hinge (3) and being provided with respective first and second segments (4, 5) of an annular magnetic circuit, each segment (4, 5) having a proximal end (7, 8) and a distal end (9, 10) relative to the hinge, and at least the first segment (5) being mounted to rock about a rocker axis (6) parallel to a hinge a axis (3), the jaws being movable about the hinge axis under the action of the drive member between a closed position in which the distal ends (9, 10) and the proximal ends (7, 8) of the segments (4, 5) are respectively in contact, and an open position in which the distal ends (9, 10) and the proximal ends (7, 8) are spaced apart, the clamp including spacer member (12) movable between an active position in which the spacer member has a cam-forming portion (13) co-operating at least with the proximal end (8) of the first segment (5) to space it apart positively from the proximal end (7) of the second segment (4) at least while the distal ends (9, 10) are spaced apart by a distance that is greater than or equal to a predetermined safety distance, and an inactive position in which the spacer member (12) releases relative movement between the segments.

2. A measuring clamp according to claim 1, wherein the spacer member (12) in the inactive position is associated with a stop (16) for locking the jaws closer than an intermediate open position in which the distal ends (9, 10) are spaced apart by a distance equal to the safety distance, and wherein the spacer member in the active position escapes from this stop.

3. A measuring clamp according to claim 2, wherein the spacer member (12) is mounted to slide on the first jaw (5) and the stop (16) forms a part of the second jaw (4), the spacer member having an end (14) opposite its cam-forming end and extending to face the stop when the jaws (1, 2) are in the closed position, and when the spacer member is in the inactive position so that the stop opposes opening of the jaws, said end (14) of the spacer member being withdrawn from the stop when the spacer member is in the active position.

4. A measuring clamp according to claim 3, wherein the end (14) opposite from the cam-forming end (13) is in the form of a pusher suitable for being operated manually.

5. A measuring clamp according to claim 1, wherein the spacer member (12) extends between at least one cam surface carried by one jaw (1, 2) and an adjacent projection (20, 21) at the proximal end (7, 8) of a magnetic circuit segment mounted to rock on the corresponding jaw, the cam-forming portion (13) of the spacer member extending in register with the corresponding projection of the magnetic circuit segment.

6. A measuring clamp according to claim 5, wherein each projection comprises a stud (20, 21) projecting laterally.

7. A measuring clamp according to claim 5, wherein the two segments (4, 5) of the magnetic circuit are mounted to rock on the corresponding jaws, and wherein the spacer member (12) has a tail (27) extending between the jaws beyond the cam-forming portion (13).

* * * * *